United States Patent [19]

Kettle et al.

[11] 4,365,287
[45] Dec. 21, 1982

[54] SWITCHING DEVICE

[75] Inventors: Leslie J. Kettle, Chelmsford; Barry P. Newton, Boreham, both of England

[73] Assignee: English Electric Valve Company Limited, Chelmsford, England

[21] Appl. No.: 185,383

[22] Filed: Sep. 8, 1980

[30] Foreign Application Priority Data

Sep. 7, 1979 [GB] United Kingdom ............... 7931073

[51] Int. Cl.³ .............................................. H03K 3/53
[52] U.S. Cl. ................................... 363/94; 323/272; 307/108
[58] Field of Search .................. 363/94, 99, 114–119; 328/76–84, 89, 95–97, 100, 233–238; 323/225, 227–228, 254, 263, 269, 272, 291–292, 323, 339; 307/108

[56] References Cited

U.S. PATENT DOCUMENTS 3,119,968  1/1964  Schonberg .................. 328/233 X
3,514,692  5/1970  Lingle ............................ 323/272
3,638,127  1/1972  Kerns ......................... 328/233 X

FOREIGN PATENT DOCUMENTS 1344802  1/1974  United Kingdom .

Primary Examiner—William M. Shoop
Assistant Examiner—Peter S. Wong
Attorney, Agent, or Firm—Spencer & Kaye

[57] ABSTRACT

A switch device comprising at least two switches (12, 13) connected in parallel in a first electric path; a timing device (3) for feeding at a required time, a switching impulse along a second electric path to the switches thereby switching at least one of them (12) to a conductive state so that current flows along the first path; and a transformer (18) having a primary (20) in the said first path and a secondary (17) in the said second path arranged so that the aforementioned current induces a further switching impulse or reinforces the first switching impulse thereby switching or assisting the switching of the other switch (13) to a conductive state.

4 Claims, 1 Drawing Figure

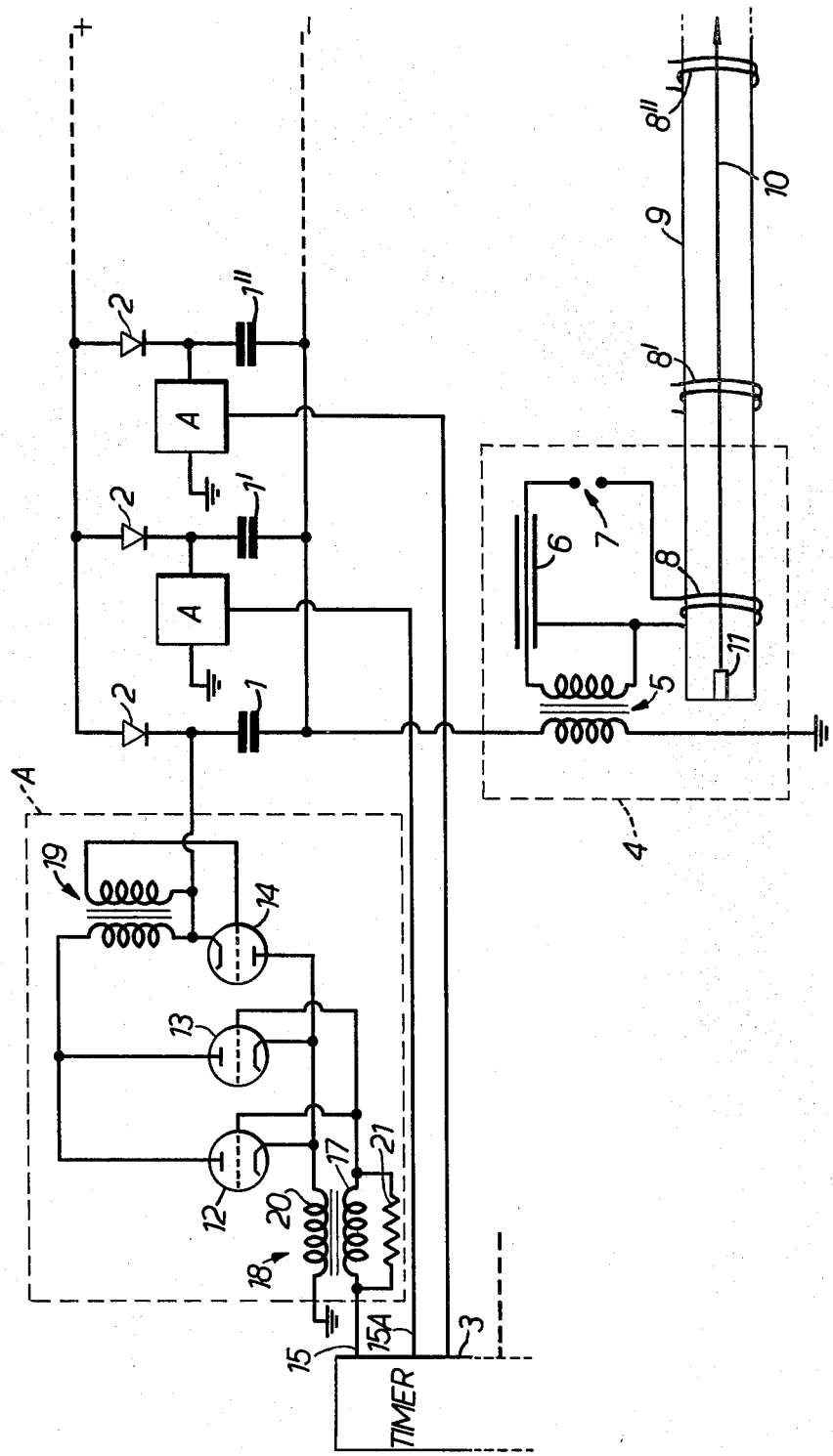

SWITCHING DEVICE

BACKGROUND OF THE INVENTION

This invention relates to a switching device and arose because of the need for a thyratron switch capable of high speed switching of very large currents.

U.K. Patent Specification No. 1344802 (Philips) describes a semiconductor switching device comprising a number of switches 7, 9, 11 and 13 connected in parallel. A switching impulse is applied to terminal $B_1$, through diode 17, line 18 and resistors 20, 21, 22, 23 to the control electrodes of the switches to switch them on simultaneously. Should one switch (e.g. switch 7) operate before the others it passes a current from terminal $A_1$, through resistor 6 and a transformer primary 15 to terminal $C_1$. This induces an impulse in transformer secondary 16 which passes through a diode 19 to reinforce the switching impulse on line 18 thereby expediting operation of the other switches.

The diode 17 is needed to prevent the impulse in the transformer secondary being short circuited to terminal $B_1$. The diode 19 is needed in order to prevent the switching impulse from terminal $B_1$, being short circuited through transformer secondary 16 to terminal $C_1$.

This known circuit is not practicable for switching very high currents since the number of individual semiconductor switches would be prohibitive. For high currents it is necessary to use thyratrons but thyratrons cannot be connected in parallel in the manner described for semiconductor switches in the aforementioned Philips Specification. This is because a thyratron may develop for a short time, immediately after switching, a very high potential on its control grid. This would destroy diodes like those shown at 17 and 18 in the Philips Specification. The obvious way of dealing with this problem would be to replace the diodes 17 and 19 with suitable alternative diodes capable of holding off the aforementioned potential. This however would introduce a serious cost problem.

BRIEF SUMMARY OF THE INVENTION

The invention provides a switch device comprising two or more switches connected in parallel in a first electric path; a timing device for feeding at a required time, a switching impulse along a second electric path to the switches thereby switching at least one of them to a conductive state so that current flows along the first path; and a transformer, having a primary in the said first path and a secondary in the said second path arranged so that the aforementioned current induces a further switching impulse or reinforces the first switching impulse thereby switching or assisting the switching of the other switch to a conductive state.

By employing the invention as defined above, two thyratrons connected in parallel can be made to operate at substantially the same instant, thereby doubling the power handling capability of a single thyratron, without the need for isolating diodes and the associated problems.

The transformer may advantageously include a resistor connected across its secondary winding to reduce the impedance presented to the switching impulse.

BRIEF DESCRIPTION OF THE DRAWINGS

The drawing is a diagram of a particle accelerator employing a plurality of switching devices constructed in accordance with the invention.

DETAILED DESCRIPTION

Referring to the drawing, there are ten capacitors 1 (only three shown) arranged to be charged through diodes 2 from a source of positive potential. Each capacitor 1 is associated with a switch circuit A (only one of which is shown in detail). These switching circuits A are triggered in turn by trigger pulses from a timing circuit 3 so as to connect the positive side of the capacitor 1 to earth. The negative side is also connected to earth through a load 4 so that, when switch A is closed, capacitor 1 discharges through the load.

The load 4 is inductive so that it stores energy as each capacitor 1, 1', 1" etc. is discharged. This stored energy causes current to continue to flow in the initial direction until the capacitor 1 assumes a particular reverse potential, whereupon the direction of the current is reversed. Thus, when each capacitor discharges it produces a pulse through the load 4 which pulse has an initial period when current flows in one direction and a second period when current flows in the reverse direction.

The load 4 comprises a resonant transformer 5 connected to a Blumlein 6 which is well known per se, being a type of co-axial line serving as a store of energy. The Blumlein is discharged through a spark gap 7 by trigger pulses produced by circuitry (not shown) which produces the pulses at the primary of transformer 5. The discharge takes place through one coil 8 of a particle accelerating tube 9. The purpose of the Blumlein 6 and spark gap 7 is to convert the pulses fed to the primary of the transformer 5 into square waves.

The tube 9 has, associated with it, a plurality of circuits identical to that described, each energising a different coil, e.g. as shown at 8', 8". These are all controlled by the same timer 3, which ensures that a sequence of pulses in coil 8 is followed by a sequence of pulses in coil 8' etc. so as to accelerate the particles along the path 10 from a source 11.

The essence of the invention is incorporated in each of the circuits A which will now be described in detail.

A circuit A includes three thyratrons 12, 13 and 14 connected in parallel, thyratrons 12, 13 being connected to pass current in one direction and the thyratron 14 being connected to pass current in the opposite direction.

The production of a pulse is initiated by a triggering impulse from the timer 3 on line 15. This trigger impulse passes through the secondary coil 17 of a transformer 18 to the control grids of thyratrons 12 and 13 thereby switching them to their conductive states.

In practice, one of the thyratrons, say thyratron 12, will fire first. This allows the first capacitor 1 to discharge in a forward direction through the circuit including the primary of a transformer 19, thyratron 12, the primary 20 of transformer 18, earth, and the load 4. As soon as this discharge begins, it is detected by transformer 18 which induces an enhanced trigger impulse on line 15 thereby firing the second thyratron 13. Two thyratrons 12 and 13 are necessary to handle the required current in the forward direction.

When the discharge current of capacitor 1 through the primary of transformer 19 reaches a predetermined value it induces a potential across the secondary of that transformer sufficient to fire the thyratron 14. Current continues to flow in the forward direction after the capacitor 1 has become completely discharged. This is because of the stored energy in the inductance of transformer primary 5. The continuing flow of current charges the capacitor 1 with a reverse polarity and, when this has reached a peak it causes current to flow in the reverse direction through the load 4, earth, transformer primary 20 and thyratron 14. This reverse current provides the necessary second period of the pulse referred to previously. It ensures an efficient coupling factor for the transformer 5.

The sequence of events described above is followed by a trigger pulse being supplied by circuit 3 on line 15A. The process is repeated ten times until all the capacitors have been discharged. There is then a pause for a sufficient time to enable the capacitors 1 to be re-charged through the diodes 2.

It should be explained that, by the time an impulse appears on line 15A, the impulse on line 15 has been removed and the thyratrons 12, 13 have reverted to their non-conductive states.

It may be found desirable or necessary to include a resistor 21 connected in parallel with the secondary 17 of the transformer 18. This resistor provides a low impedance a/c path allowing the timing pulse from timer 3 to pass to the thyratron control grids without suffering delay or distortion which might otherwise occur as a result of the impedance of the secondary 17.

We claim:

1. A switch device comprising:
   two switches connected in parallel in a first electric path;
   a timing device for feeding at a required time a switching impulse along a second electric path to said switches thereby switching at least one of them to a conductive state so that current flows along the first path;
   and a transformer having a primary in said first path and a secondary in said second path;
   said transformer, said switches and said timing device being interconnected for causing the current flow created by switching of one of said switches to induce a further switching impulse or to reinforce the first-recited switching impulse thereby switching or assisting the switching of the other switch to a conductive state.

2. A switch device according to claim 1 wherein a resistor is connected across the transformer secondary.

3. A switching device according to claim 1 or 2 wherein each switch is a thyratron.

4. A switching device according to claim 1 or 2 wherein: each said switch includes a main current path in series with the first electric path and a control element connected to receive switching impulses for controlling the conductive state of said main current path; and said transformer secondary is connected in series in said second path between said timing device and said control elements of said switches.

* * * * *